(12) United States Patent
Cheng et al.

(10) Patent No.: US 7,705,386 B2
(45) Date of Patent: Apr. 27, 2010

(54) PROVIDING ISOLATION FOR WORDLINE PASSING OVER DEEP TRENCH CAPACITOR

(75) Inventors: Kangguo Cheng, Guilderland, NY (US); Johnathan E. Faltermeier, Delanson, NY (US); Herbert L. Ho, New Windsor, NY (US); Paul C. Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 11/969,989

(22) Filed: Jan. 7, 2008

(65) Prior Publication Data

US 2009/0173980 A1 Jul. 9, 2009

(51) Int. Cl.
*H01L 27/108* (2006.01)
*H01L 21/8244* (2006.01)

(52) U.S. Cl. .................. 257/301; 257/305; 257/311; 438/239; 438/241; 438/243

(58) Field of Classification Search ............... 257/301, 257/304, 305, 311; 438/239, 241, 243
See application file for complete search history.

(56) References Cited

U.S. PATENT DOCUMENTS

| | | | |
|---|---|---|---|
| 6,037,194 A * | 3/2000 | Bronner et al. ............ 438/147 |
| 6,451,654 B1 | 9/2002 | Lin et al. | |
| 6,509,226 B1 | 1/2003 | Jaiprakash et al. | |
| 6,660,581 B1 * | 12/2003 | Yang et al. ............ 438/242 |
| 6,744,089 B2 | 6/2004 | Wu | |
| 6,767,750 B2 | 7/2004 | Summerfelt et al. | |
| 6,815,292 B1 | 11/2004 | Fang et al. | |
| 6,849,890 B2 * | 2/2005 | Kokubun ............ 257/296 |
| 6,960,781 B2 | 11/2005 | Currie et al. | |
| 6,998,666 B2 | 2/2006 | Beintner et al. | |
| 7,127,569 B2 | 10/2006 | Lo et al. | |
| 2003/0124791 A1 | 7/2003 | Summerfelt et al. | |
| 2005/0151181 A1 | 7/2005 | Beintner et al. | |
| 2006/0205150 A1 | 9/2006 | Dong | |
| 2006/0231918 A1 | 10/2006 | Popp et al. | |

* cited by examiner

*Primary Examiner*—Howard Weiss
*Assistant Examiner*—Steven H Rao
(74) *Attorney, Agent, or Firm*—Joseph P. Abate; Howard M. Cohn

(57) ABSTRACT

A memory cell has an access transistor and a capacitor with an electrode disposed within a deep trench. STI oxide covers at least a portion of the electrode, and a liner covers a remaining portion of the electrode. The liner may be a layer of nitride over a layer of oxide. Some of the STI may cover a portion of the liner. In a memory array a pass wordline may be isolated from the electrode by the STI oxide and the liner.

20 Claims, 7 Drawing Sheets

PROVIDING ISOLATION FOR WORDLINE PASSING OVER DEEP TRENCH CAPACITOR

FIELD OF THE INVENTION

The invention relates to semiconductor devices and, more particularly to dynamic random access memory (DRAM), including embedded DRAM (eDRAM) and, more particularly, to DRAM/eDRAM having wordlines passing over deep trench (DT) capacitors and requiring isolation therefrom.

BACKGROUND OF THE INVENTION

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source, gate and drain. In the FET, a small amount of voltage is applied to the gate (G) in order to control current flowing between the source (S) and drain (D). In FETs, the main current appears in a narrow conducting channel formed near (usually primarily under) the gate. This channel connects electrons from the source terminal to the drain terminal. The channel conductivity can be altered by varying the voltage applied to the gate terminal or by enlarging or constricting the conducting channel and thereby controlling the current flowing between the source and the drain.

FIG. 1A illustrates a FET 100 comprising a p-type substrate (or a p-well in the substrate), and two spaced-apart n-type diffusion areas—one of which will serve as the "source", the other of which will serve as the "drain" of the transistor.

The space between the two diffusion areas is called the "channel". The channel is where current flows, between the source (S) and the drain (D). A schematic symbol for an n-channel MOSFET appears to the left of FIG. 1A.

A thin dielectric layer is disposed on the substrate above the channel, and a "gate" structure (G) is disposed over the dielectric layer, thus also atop the channel. (The dielectric under the gate is also commonly referred to as "gate oxide" or "gate dielectric".)

Electrical connections (not shown) may be made to the source (S), the drain (D), and the gate (G). The substrate may be grounded or biased at a desired voltage depending on applications.

Generally, when there is no voltage applied to the gate, there is no electrical conduction (connection) between the source and the drain. As voltage (of the correct polarity, plus or minus) is applied to the gate, there is a "field effect" in the channel between the source and the drain, and current can flow between the source and the drain. This current flowing in the channel can be controlled by the voltage applied to the gate. In this manner, a small signal (gate voltage) can control a relatively large signal (current flow between the source and the drain).

The FET 100 is exemplary of a MOSFET (metal oxide semiconductor FET) transistor. With the specified "n" and "p" types shown above, an "n-channel MOSFET" can be formed. With opposite polarities (swapping "p" for "n" in the diffusions, and "n" for "p" in the substrate or well), a p-channel FET can be formed. In CMOS (complementary metal oxide semiconductor), both n-channel and p-channel MOS transistors are used, often paired with one another.

While particular n- and p-type dopants are described herein according to NMOS technology, it is to be appreciated that one or more aspects of the present invention are equally applicable to forming a PMOS (generally, simply by reversing the n- and p-type dopants).

An integrated circuit (IC) device may comprise many millions of FETs on a single semiconductor "chip" (or "die"), measuring only a few centimeters on each side. Several chips may be formed simultaneously, on a single "wafer", using conventional semiconductor fabrication processes including deposition, doping, photolithography, and etching.

U.S. Pat. No. 3,387,286 (IBM; 1968) discloses field effect transistor memory. The memory is formed of an array of memory cells controlled for reading and writing by word lines and bit lines which are connected to the cells. Each cell is formed using a single FET and a single capacitor. The gate electrode of the FET is connected to the word line, the source terminal is connected to the bitline, and the drain terminal is connected to one of the (two) electrodes of the capacitor. The other electrode of the capacitor is connected to a reference potential. Information is stored by charging the capacitor through the transistor, and information is read out by discharging the capacitor through the transistor. During a "write" operation, the wordline which is connected to the gate of the transistor is energized to render the transistor conductive between source and drain. If a "zero" is to be stored, the bitline is not energized and the capacitor is not charged. If a "one" is to be stored, the bitline is energized and the capacitor is charged to substantially the potential (voltage) of the bitline signal. During "read" operations, only the wordline is energized and a signal is transmitted to the bit lie if a "one" has been stored previously (the capacitor is charged). Since the charge on the capacitor leaks off, it is necessary to periodically regenerate the information stored in the memory.

Memory Array Architecture Generally

Dynamic random access memory (DRAM) is a type of random access memory that usually stores data as electrical charges in a capacitor structure associated with a transistor. Since capacitors leak charge (generally, a capacitor is only useful for temporarily storing an electrical charge), the information (data) eventually fades unless the capacitor charge is refreshed (read, and re-written) periodically, such as every 64 ms (milliseconds). DRAM is usually arranged in an array of one capacitor and transistor per "cell".

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

FIG. 1B illustrates an array of DRAM cells (labeled "a" through "i") connected to a number of word lines (WL) and bit lines (BL). (Each DRAM cell is shown as comprising a FET and a capacitor.) For example, in the memory cell "e", the FET has its gate connected to WL(n), its source is connected to BL(n), and its drain connected to one terminal of a capacitor. The other terminal of the capacitor is connected to ground. The nine memory cells ("a" through "i") illustrated in FIG. 1B are exemplary of many millions of memory cells that may be resident on a single chip.

The gates of the FETs in memory cells "a", "b" and "c" are all connected to the same word line WL(n−1), the gates of the FETs in memory cells "d", "e" and "f" are all connected to the same word line WL(n), and the gates of the FETs in memory cells "g", "h" and "i" are all connected to the same word line WL(n+1). Thus, a voltage applied to a given word line (WL) can affect many memory cells—namely all the memory cells connected to that word line.

Similarly, the sources of the FETs in memory cells "a", "d" and "g" are all connected to the same bit line BL(n−1), the sources of the FETs in memory cells "b", "e" and "h" are all connected to the same bit line BL(n), and the sources of the FETs in memory cells "c", "f" and "i" are all connected to the same bit line BL(n+1). Thus, a voltage applied to a given bit line (BL) can affect many memory cells—namely all the memory cells connected to that word line.

DRAM (eDRAM)

Generally, the DRAM cells discussed herein comprise a capacitor formed in a deep trench (DT) in a substrate, and an "access transistor" formed on the surface of the substrate adjacent and atop the capacitor. The capacitor ("DT capacitor") generally comprises a first conductive electrode called the "buried plate" which is a heavily doped region of the substrate surrounding the trench, a thin layer of insulating material such as oxide lining the trench, and a second conductive electrode such as a heavily doped polycrystalline plug (or "node") disposed within the trench.

The transistor may comprise a FET having one of its source/drain (S/D) terminals connected to (or an extension of) the second electrode (node) of the capacitor.

In trench DRAM/eDRAM, the pass gate is desirably isolated from the underlying DT poly. In prior art the isolation is achieved by a thin shallow trench isolation (STI) oxide. However, thin STI oxide may be consumed before the pass gate is formed, leading to poor electrical isolation between the pass gate and DT poly. This is illustrated in FIGS. 2, 2A and 2B. In conventional memory arrays, the wordlines may serve as the gates of the cell (access) transistors.

FIG. 2 illustrates a DRAM cell 200 of the prior art, generally comprising an access transistor and an associated cell capacitor. Also shown is a wordline (WL), or "pass gate", passing over the DT capacitor. The DRAM cell is generally formed, as follows.

Beginning with a semiconductor substrate 202, a deep trench (DT) 210 is formed, extending into the substrate 202, from a top (as viewed) surface thereof. The substrate 202 may comprise a SOI substrate having a layer 204 of silicon (SOI) on top of an insulating layer 206 which is atop an underlying silicon substrate 208. The insulating layer 206 typically comprises buried oxide (BOX). The deep trench (DT) 210 is for forming the cell capacitor (or "DT capacitor"), as follows. The trench 210 may have a width of about 50 nm to 200 nm and a depth of 1000 nm to 10000 nm, by way of example.

The cell capacitor generally comprises a first conductor called the "buried plate" which is a heavily doped region 212 of the substrate surrounding the trench 210, a thin layer 214 of insulating material lining the trench 210, and a second conductor 216 such as a heavily doped polycrystalline plug (or "node", "DT poly") disposed within the trench 210. A cell transistor ("access transistor") 220 may comprise a FET having one of its source/drain (S/D) terminals connected to (or an extension of) the second conductor (node) of the capacitor, as follows.

The FET 220 comprises two spaced-apart diffusions, 222 and 224, within the surface of the substrate 202—one of which will serve as the "source" and the other of which will serve as the "drain" (D) of the transistor 220. The space between the two diffusion areas is called the "channel" (and is approximately where the legend "SOI" appears). A thin dielectric layer 226 is disposed on the substrate above the channel, and a "gate" structure (G) 228 is disposed over the dielectric layer 226, thus also atop the channel. (The dielectric under the gate is also commonly referred to as "gate oxide" or "gate dielectric".) The gate 228 may be a portion of an elongate wordline, referred to (for this memory cell) as the "active wordline" (Active WL).

Generally, a plurality of DRAM/eDRAM memory cells in a given row of a memory array may utilize a given wordline as the gates for their access transistors. And the source diffusions of the DRAM/eDRAM memory cells in a given column of a memory array may utilize a given bitline as the sources (S) for their access transistors.

In modern CMOS technology, shallow trench isolation (STI) is commonly used to isolate one (or more) transistors from other transistors, for both logic and memory. As shown in FIG. 2, a shallow trench 232 may be formed, surrounding the access transistor 220 (only one side of the transistor is shown). Note that the trench 232 extends over the DT (node) poly 216, a top portion of which is adjacent the drain (D) of the transistor 220. Therefore, the trench 232 is less deep (thinner) over the DT poly 216 and immediately adjacent the drain (D) of the transistor 220, and may be deeper (thicker) further from the drain (D) of the transistor 220 (and, as shown, over top portion of the DT poly 216 which is distal from (not immediately adjacent to) the drain (D) of the transistor 220.

The STI trench 232 may be filled with an insulating material, such as oxide (STI oxide) 234. Because of the thin/thick trench geometry which has been described, the STI oxide will exhibit a thin portion 234a where it is proximal (adjacent to) the drain (D) of the transistor 220, and a thicker portion where it is distal from (not immediately adjacent to) the drain (D) of the transistor 220. Were the STI to be too thick immediately adjacent to the drain (D) of the transistor 220, this would interfere with the ohmic contact between the drain (D) and the node poly 216.

As mentioned above, a plurality of memory cells may be associated with a given word line (WL). Furthermore, the wordline may form the gates of the access transistors of those memory cells. In this example, the transistor 220 of the memory cell 200 is associated with the "active" wordline, which forms its gate (G). Another wordline, for another plurality of memory cells is shown, and is labelled "Pass WL" 240. And, as can be seen, the Pass WL 240 passes over the STI 234, above the node poly 216. This can create problems as follows.

The dashed-line circled area in FIG. 2 is expanded upon (magnified) in FIGS. 2A and 2B. FIG. 2A illustrates good isolation when thin STI oxide 234a remains over DT poly 216. FIG. 2B illustrates poor isolation when thin STI oxide (234a) is consumed over DT poly 216.

Related Patents and Publications

U.S. Pat. No. 6,998,666 (IBM; 2006), incorporated in it entirety by reference herein, discloses nitrided STI liner oxide for reduced corner device impact on vertical device performance. A method of fabricating an integrated circuit device comprises etching a trench in a substrate and forming a dynamic random access memory (DRAM) cell having a storage capacitor at a lower end and an overlying vertical metal oxide semiconductor field effect transistor (MOSFET) comprising a gate conductor and a boron-doped channel. The method includes forming trenches adjacent the DRAM cell and a silicon-oxy-nitride isolation liner on either side of the DRAM cell, adjacent the gate conductor. Isolation regions are then formed in the trenches on either side of the DRAM cell. Thereafter, the DRAM cell, including the boron-containing channel region adjacent the gate conductor, is subjected to elevated temperatures by thermal processing, for example, forming a support device on the substrate adjacent the isolation regions. The nitride-containing isolation liner reduces segregation of the boron in the channel region, as compared to an essentially nitrogen-free oxide-containing isolation liner. See also Publication No. 2005/0151181.

US Patent Publication No. 2006/0231918 (Popp et al.; 2006), incorporated in its entirety by reference herein, discloses field effect transistor and method for the production thereof. A transistor is provided which advantageously utilizes a part of the area which, in conventional transistors, is provided for the isolation between the transistors. In this case, the channel width can be enlarged in a self-aligned manner without the risk of short circuits. The field-effect transistor according to the invention has the advantage that it is possible to ensure a significant increase in the effective channel width for the forward current ION compared with previously used, conventional transistor structures, without having to accept a reduction of the integration density that can be attained. Thus, by way of example, the forward current ION can be increased by up to 50%, without having to alter the arrangement of the active regions or of the trench isolation.

U.S. Pat. No. 6,960,781 (Currie et al.; 2005), incorporated in its entirety by reference herein, discloses a shallow trench isolation process. A structure including a transistor and a trench structure, with the trench structure inducing only a portion of the strain in a channel region of the transistor.

U.S. Pat. No. 6,744,089 (Wu; 2004) incorporated in its entirety by reference herein, discloses a self-aligned lateral-transistor DRAM cell structure in which a trench structure comprises a trench region and a trench-isolation region being formed in a side portion of the trench region and a self-aligned lateral-transistor structure comprises a merged common-source diffusion region, a self-aligned gate-stack region, and a self-aligned common-drain diffusion region being formed in another side portion of the trench region by using spacer-formation techniques. The unit cell size of the self-aligned lateral-transistor DRAM cell structure can be fabricated to be equal to 6 $F^2$ or smaller. The self-aligned lateral-transistor DRAM cell structure is used to implement two contactless DRAM arrays for high-speed read and write operations.

U.S. Pat. No. 6,509,226 (IBM; 2003), incorporated in its entirety by reference herein, discloses process for protecting array top oxide. Processing of a DRAM device containing vertical MOSFET arrays proceeds through planarization of the array gate conductor (GC) polysilicon of the vertical MOSFET to the top surface of the top oxide. A thin polysilicon layer is deposited over the planarized surface and an active area (M) pad nitride and tetraethyl orthosilicate (TEOS) stack are deposited. The M mask is used to open the pad layer to the silicon surface, and shallow trench isolation (STI) etching is used to form isolation trenches. An active area (AA) oxidation is performed, and the isolation trenches are filled with high density plasma (HDP) oxide and planarized to the top surface of the AA pad nitride. Following isolation trench (IT) planarization, the AA pad nitride is stripped, with the thin silicon layer serving as an etch stop protecting the underlying top oxide. The etch support (ES) nitride liner is deposited, and the ES mask is patterned to open the support areas. The ES nitride, thin polysilicon layer and top oxide are etched from the exposed areas. A sacrificial oxidation is applied along with well implants, support gate oxidation and support gate polysilicon deposition. Using the etch array (EA) mask, the support gate polysilicon is opened in the array. The ES nitride is removed selective to the underlying silicon layer, protecting the top oxide. The gate stack is deposited and patterned and the process continues to completion.

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®)

| | |
|---|---|
| Anisotropic | literally, one directional. An example of an anisotropic process is sunbathing. Only surfaces of the body exposed to (facing in the direction of) the sun become tanned. See isotropic. |
| bit | The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte. |
| BL | short for bit line. The bit line is a conductor connected to at least one of the source or drain terminals of a memory cell transistor. In DRAM, the bitline is typically connected to the source of the transistor, and the drain is connected to one of the electrodes of the memory cell capacitor. |
| Capacitor | A capacitor is a two-terminal device (electrical or electronic component) that can store energy in the electric field between a pair of conductive electrodes (called "plates"). The process of storing energy in the capacitor is known as "charging", and involves electric charges of equal magnitude, but opposite polarity, building up on each plate. |
| Cell Well | (CW) the cell well is an area in the silicon substrate that is prepared for functioning as a transistor or memory cell device by doping with an electron acceptor material such as boron or indium (p, electron acceptors or holes) or with an electron donor material such as phosphorous or arsenic (n, electron donors). The depth of a cell well is defined by the depth of the dopant distribution. |
| CMOS | short for complementary metal oxide semiconductor. CMOS consists of n-channel and p-channel MOS transistors. Due to very low power consumption and dissipation as well as minimization of |

| | -continued |
|---|---|
| | the current in "off" state, CMOS is a very effective device configuration for implementation of digital functions. CMOS is a key device in state-of-the-art silicon microelectronics.<br>CMOS Inverter: A pair of two complementary transistors (a p-channel and an n-channel) with the source of the n-channel transistor connected to the drain of the p-channel transistor, and the gates connected to each other. The output (drain of the p-channel transistor) is high whenever the input (gate) is low and the other way round. The CMOS inverter is the basic building block of CMOS digital circuits.<br>NMOS: n-channel CMOS.<br>PMOS: p-channel CMOS. |
| CMP | short for chemical-mechanical polishing. CMP is a process, using both chemicals and abrasives, comparable to lapping (analogous to sanding), for removing material from a built up structure. For example, after depositing and etching a number of elements, the top surface of the resulting structure may very uneven, needing to be smoothed (or levelled) out, prior to performing a subsequent process step. Generally, CMP will level out the high spots, leaving a relatively smooth planar surface. |
| CVD | short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polycrystalline, amorphous, and epitaxial. These materials include: silicon, oxide, nitride and metals, such as are commonly used in semiconductor fabrication. |
| deposition | Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate. |
| Dopant | element introduced into semiconductor to establish either p-type (acceptors) or n-type (donors) conductivity; common dopants in silicon: p-type, boron, B, Indium, In; n-type phosphorous, P, arsenic, As, antimony, Sb. Dopants are of two types - "donors" and "acceptors". N type implants are donors and P type are acceptors. |
| doping | doping is the process of introducing impurities (dopants) into the semiconductor substrate, or elements formed on the semiconductor substrate, and is often performed with a mask (or previously-formed elements in place) so that only certain areas of the substrate will be doped. For example, doping is used to form the source and drain regions of an FET. An ion implanter is typically employed for the actual implantation. An inert carrier gas such as nitrogen is usually used to bring in the impurity source (dopant).<br>Usually in doping, a dopant, a dosage and an energy level are specified and/or a resulting doping level may be specified. A dosage may be specified in the number of atoms per $cm^2$ and an energy level (specified in keV, kilo-electron-volts), resulting in a doping level (concentration in the substrate) of a number of atoms per $cm^3$. The number of atoms is commonly specified in exponential notation, where a number like "3E15" means 3 times 10 to the 15th power, or a "3" followed by 15 zeroes (3,000,000,000,000,000). To put things in perspective, there are about 1E23 (100,000,000,000,000,000,000,000) atoms of hydrogen and oxygen in a cubic centimeter (cm3) of water.<br>An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$. ("/$cm^3$" may also be written "$cm^{-3}$") |
| DRAM | short for dynamic random access memory. DRAM is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Like SRAM, it is in the class of volatile memory devices, since it loses its data when the power supply is removed. |
| eDRAM | short for embedded DRAM. eDRAM is a capacitor-based dynamic random access memory usually integrated on the same die or in the |

| | |
|---|---|
| | same package as the main ASIC or processor, as opposed to external DRAM modules and transistor-based SRAM typically used for caches. |
| etching | etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch.<br>Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically.<br>Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. |
| FET | short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (G). |
| isotropic | literally, identical in all directions. An example of an isotropic process is dissolving a tablet in water. All exposed surfaces of the tablet are uniformly acted upon. (see "anisotropic") |
| lithography | In lithography (or "photolithography"), a radiation sensitive "resist" coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example. |
| mask | The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask". |
| metallization | Metallization refers to formation of metal contacts and interconnects in the manufacturing of semiconductor devices. This generally occurs after the devices are completely formed, and ready to be connected with one another. A first level or layer of metallization is usually referred to as "M1". |
| MOS | short for metal oxide semiconductor. |
| MOSFET | short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs). |
| nitride | commonly used to refer to silicon nitride (chemical formula $Si_3N_4$). A dielectric material commonly used in integrated circuit manufacturing. Forms an excellent mask (barrier) against oxidation of silicon (Si). Nitride is commonly used as a hard mask (HM). |
| n-type | semiconductor in which concentration of electrons is higher than the concentration of "holes". See p-type. |
| oxide | commonly used to refer to silicon dioxide ($SiO_2$). Also known as silica. $SiO_2$ is the most common insulator in semiconductor device technology, particularly in silicon MOS/CMOS where it is used as a gate dielectric (gate oxide); high quality films are obtained by thermal oxidation of silicon. Thermal $SiO_2$ forms a smooth, |

-continued

| | |
|---|---|
| | low-defect interface with Si, and can be also readily deposited by CVD. Oxide may also be used to fill STI trenches, form spacer structures, and as an inter-level dielectric, for example. |
| plasma etching | Plasma etching refers to dry etching in which semiconductor wafer is immersed in plasma containing etching species; chemical etching reaction is taking place at the same rate in any direction, i.e. etching is isotropic; can be very selective; used in those applications in which directionality (anisotropy) of etching in not required, e.g. in resist stripping. |
| poly | short for polycrystalline silicon (Si). Heavily doped poly Si is commonly used as a gate contact in silicon MOS and CMOS devices. |
| p-type | semiconductor in which concentration of "holes" is higher than the concentration of electrons. See n-type. Examples of p-type silicon include silicon doped (enhanced) with boron (B), Indium (In) and the like. |
| resist | short for photoresist. also abbreviated "PR". Photoresist is often used as a masking material in photolithographic processes to reproduce either a positive or a negative image on a structure, prior to etching (removal of material which is not masked). PR is usually washed off after having served its purpose as a masking material. |
| RIE | short for Reactive Ion Etching. RIE is a variation of plasma etching in which during etching, the semiconductor wafer is placed on an RF powered electrode. The plasma is generated under low pressure (vacuum) by an electromagnetic field. It uses chemically reactive plasma to remove material deposited on wafers. High-energy ions from the plasma attack the wafer surface and react with it. The wafer takes on potential which accelerates etching species extracted from plasma toward the etched surface. A chemical etching reaction is preferentially taking place in the direction normal to the surface - in other words, etching is more anisotropic than in plasma etching but is less selective. RIE typically leaves the etched surface damaged. RIE is the most common etching mode in semiconductor manufacturing. |
| Si | Silicon, a semiconductor. |
| SOI | short for silicon-on-insulator. Silicon on insulator (SOI) technology refers to the use of a layered silicon-insulator-silicon substrate in place of a conventional silicon substrate in semiconductor manufacturing, especially microelectronics. SOI-based devices differ from conventional silicon-built devices in that the silicon junction is above an electrical insulator, typically silicon dioxide or (less commonly) sapphire. |
| STI | short for shallow trench isolation. Generally, a trench etched into the substrate and filled with an insulating material such as oxide, to isolate one region of the substrate from an adjacent region of the substrate. One or more transistors of a given polarity may be disposed within an area isolated by STI. |
| substrate | typically a wafer, of semiconductor material such as silicon, germanium, silicon germanium, silicon carbide, and those consisting essentially of III-V compound semiconductors such as GaAs, II-VI compound semiconductors such as ZnSe. A substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with or without strain therein, or contain regions of tensile strain and compressive strain. A substrate is often covered by an oxide layer (sometimes referred to as a "pad oxide layer"). Pad oxide is usually relatively thin, e.g., in the range of about 50 to about 500 Angstroms (5-50 nm), and can be formed, for example, by thermal oxidation of the substrate. Pad oxide may also be prepared by other methods. For example, silicon dioxide or reactive precursors like silane could be deposited by chemical vapor deposition (CVD). A nitride layer (sometimes referred to as a "pad nitride layer") may be formed to protect the pad oxide and the underlying substrate during various processing steps. It usually has a thickness in the range of about 100 Angstroms to about 6000 Angstroms (10-600 nm), such as in the range of about 1500 Angstroms to about 3000 Angstroms (150-300 nm). Conventional means can be used to apply the pad nitride, such as chemical vapor deposition (CVD). |
| Transistor | A transistor is a semiconductor device, commonly used as an amplifier or an electrically controlled switch. The transistor is the |

-continued

| | | |
|---|---|---|
| | | fundamental building block of the circuitry in computers, cellular phones, and all other modern electronic devices. Because of its fast response and accuracy, the transistor is used in a wide variety of digital and analog functions, including amplification, switching, voltage regulation, signal modulation, and oscillators. Transistors may be packaged individually or as part of an integrated circuit, some with over a billion transistors in a very small area. See FET |
| Units of Length | | Various units of length may be used herein, as follows: |
| | meter (m) | A meter is the SI unit of length, slightly longer than a yard. 1 meter = ~39 inches. 1 kilometer (km) = 1000 meters = ~0.6 miles. 1,000,000 microns = 1 meter. 1,000 millimeters (mm) = 1 meter. 100 centimeters (cm) = 1 meter. |
| | micron (μm) | one millionth of a meter (0.000001 meter); also referred to as a micrometer. |
| | mil | 1/1000 or 0.001 of an inch; 1 mil = 25.4 microns. |
| | nanometer (nm) | one billionth of a meter (0.000000001 meter). |
| | Angstrom (Å) | one tenth of a billionth of a meter. 10 Å = 1 nm. |
| V | | short for voltage. Different voltages may be applied to different parts of a transistor or memory cell to control its operation, such as: |
| | Vb | short for bulk (or substrate) voltage |
| | Vd | short for drain voltage |
| | Vg | short for gate voltage |
| | Vn | short for node voltage |
| | Vpl | short for plate voltage |
| | Vs | short for source voltage |
| | Vt | short for threshold voltage |
| | See also KeV | |
| wafer | | In microelectronics, a wafer is a thin slice of semiconducting material, such as a silicon crystal, upon which microcircuits are constructed. There are multiple orientation planes in the silicon crystal that can be used. The planes are defined by the "Miller Indices" methodology. Common orientations classified by the "Miller indices" are (100), (011), (110), and (111). |

SUMMARY OF THE INVENTION

It is a general object of the invention to provide an improved DRAM structure, having improved isolation between the DT capacitor and a passing wordline (Pass WL).

According to an embodiment of the invention, a memory cell having an access transistor and a capacitor, the capacitor comprising an electrode disposed within a deep trench, comprises STI oxide covering at least a portion of the electrode; and a liner covering a remaining portion of the electrode.

According to an embodiment of the invention, a memory array comprises: at least two wordlines, one of which is an active wordline, another of which is a pass wordline; a memory cell comprising an access transistor and a capacitor, the capacitor comprising an electrode disposed within a deep trench; STI oxide covering at least a portion of the electrode; and a liner covering a remaining portion of the electrode; wherein the pass wordline is isolated from the electrode by the liner. The pass wordline may be isolated from the electrode by the STI oxide.

According to an embodiment of the invention, a method of providing isolation for a pass wordline passing over a trench capacitor of a memory cell associated with an active wordline, the capacitor comprising an electrode disposed within a deep trench, the method comprises: providing STI oxide over at least a portion of the electrode; and providing a liner over a remaining portion of the electrode.

According to some features of the invention, the liner may comprise oxide, nitride, or a layer of nitride over a layer of oxide. A portion of the STI oxide may extend over the liner. The electrode may be recessed within the deep trench, and may comprise polysilicon

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Figure 1A:
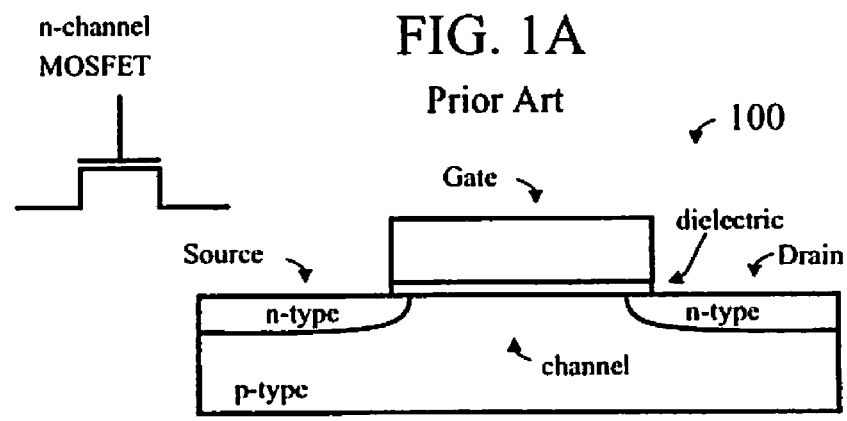

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that the edges may not be so straight, and the intersections may be rounded, due to the nature of the processes (such as etching) used to form the various elements of the semiconductor devices.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another; else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

Figure 2:
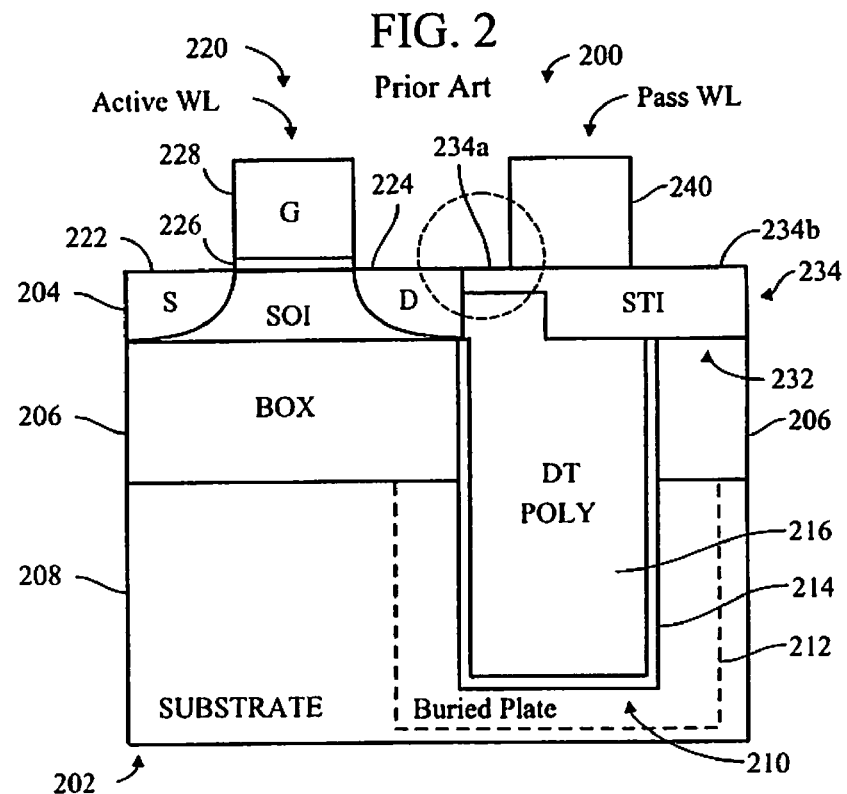

FIG. 1A is a cross-sectional view of a FET, according to the prior art.

Figure 1B:
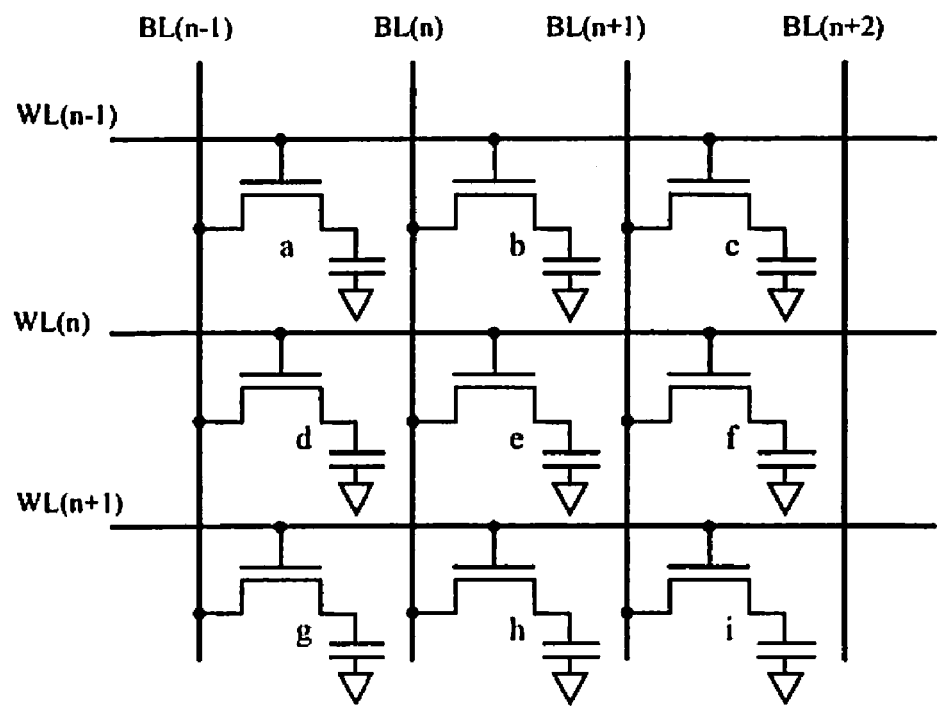

FIG. 1B is a diagram of a portion of a memory array of DRAM cells, according to the prior art.

FIG. 2 is a cross-sectional view of a DRAM cell of the prior art.

Figure 2A:
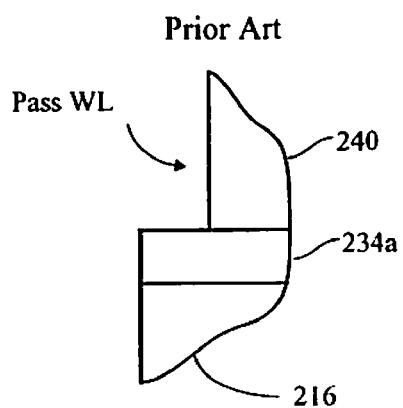

FIG. 2A is a cross-sectional view of a portion of a DRAM cell, according to the prior art.

Figure 2B:
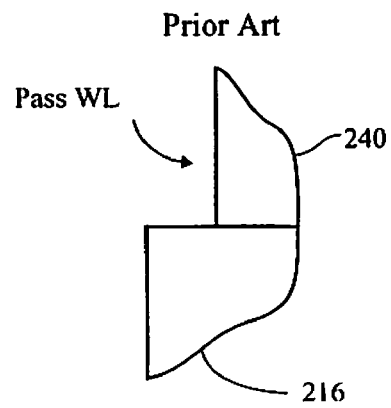

FIG. 2B is a cross-sectional view of a portion of a DRAM cell, according to the prior art.

FIGS. 3A-3G are cross-sectional views of a process for forming a DRAM cell, according to an embodiment of the invention.

Figure 4A:
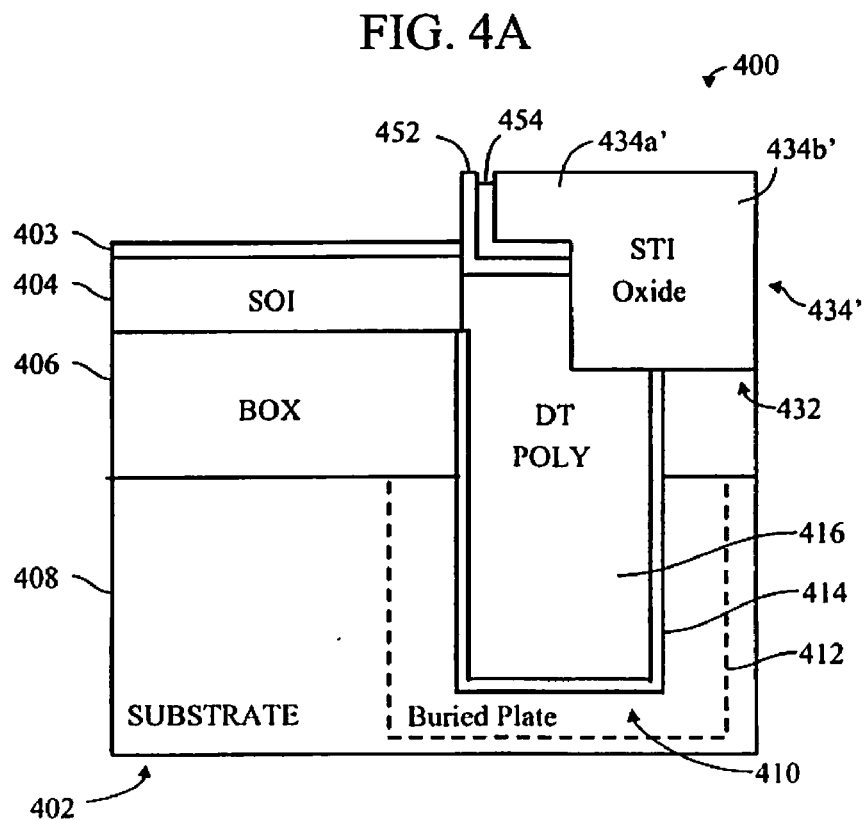
Figure 4B:
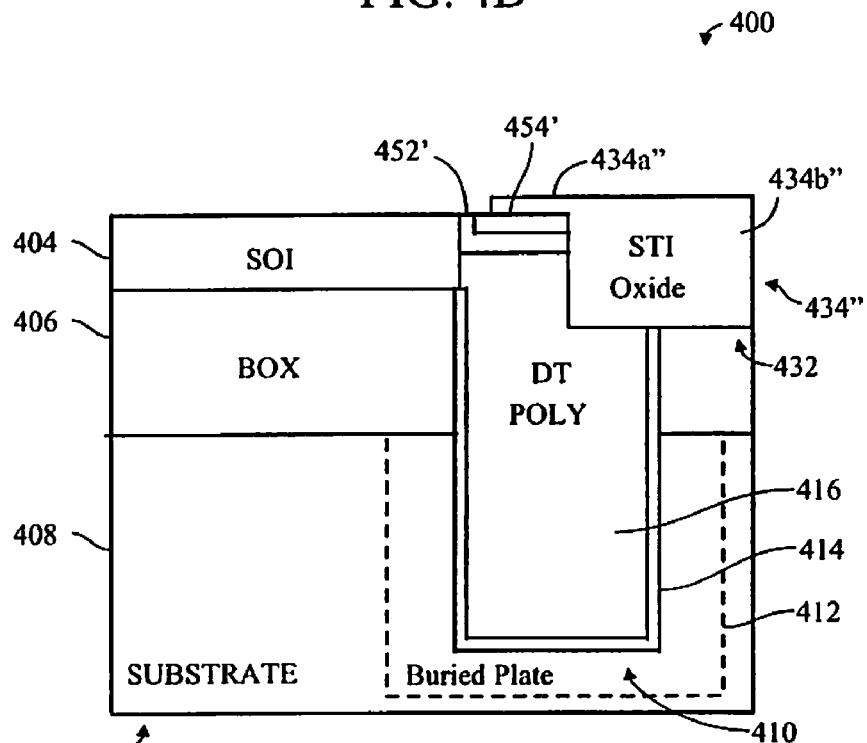
Figure 4C:
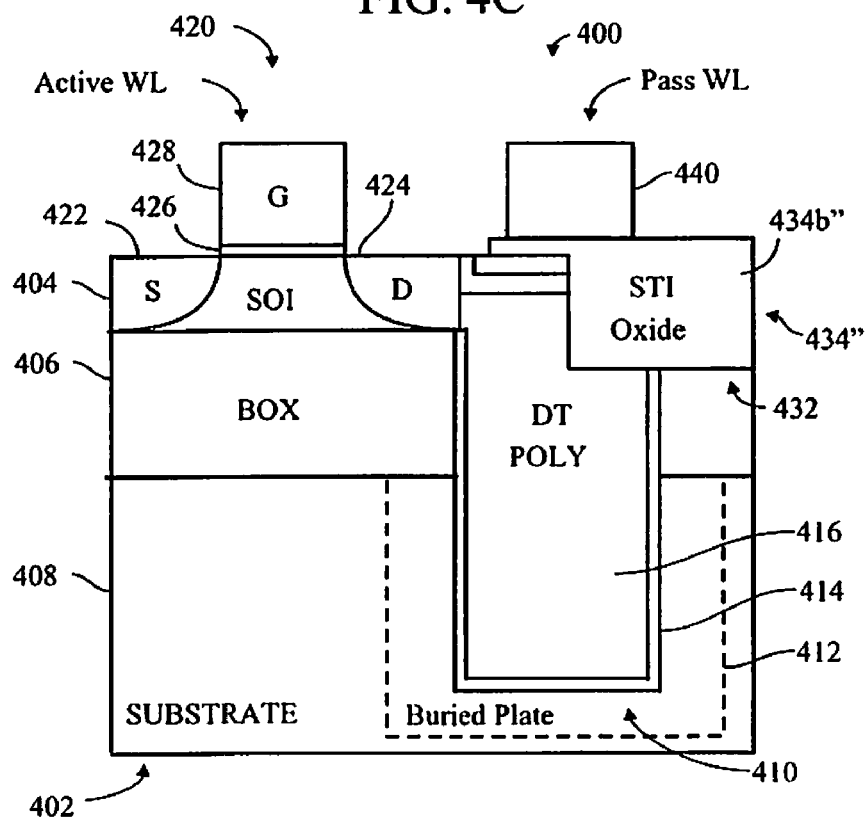

FIGS. 4A-4C are cross-sectional views of a process for forming a DRAM cell, according to an embodiment of the invention.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H$_2$O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Figure 3A:
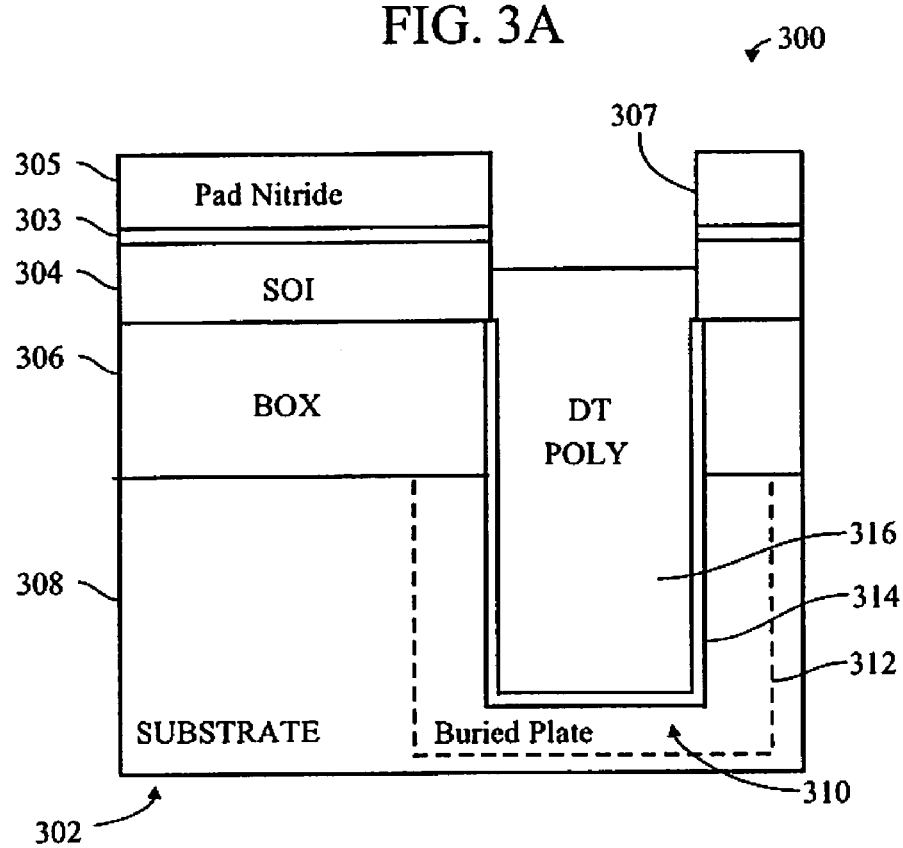

FIG. 3A illustrates a first step in an overall process of forming a DRAM cell with a liner protecting the poly node, according to an exemplary embodiment of the invention. In this step, a trench capacitor is formed on an SOI substrate by conventional processes, as follows.

In a manner similar to that shown with respect to FIG. 2, the process may begin with a SOI substrate 302 which may comprise having a layer 304 of silicon (SOI) on top of an insulating layer 306 (BOX) which is atop an underlying silicon substrate 308. Alternatively, the substrate may be a bulk substrate, for example, a bulk silicon wafer.

Here, a pad oxide layer 303 is shown atop the SOI layer 304, and a pad nitride layer 305 is shown atop the pad oxide layer 303. An opening 307 is formed through the pad nitride 305 for etching a deep trench (DT) 310 (compare 210) extending into the substrate 302, from a top (as viewed) surface thereof. The pad nitride 305, along with other layer(s) such as oxide (not shown) may serve as a mask for etching the DT. This is a conventional beginning step, and was omitted from the "finished" view of FIG. 2.

In a manner similar to that shown with respect to FIG. 2, a capacitor (trench capacitor, DT capacitor) may be formed in the trench 310, comprising a buried plate 312 as a first electrode (compare 212), an insulator 314 (compare 214) lining the trench 310, and a second electrode (poly node, DT Poly) 316 (compare 216) partially filling the trench 3 10. Note that a top portion of the trench 307 is not filled, although the process may involve first overfilling the trench with poly then etching back the poly to leave the top portion of the trench unfilled. A top surface of the poly node 316 is exposed within the trench 307. The poly node 316 extends sufficiently high in the trench 310 so that its top portion is immediately adjacent, and in contact with the SOI layer 304 wherein an associated access transistor (compare 220) will be formed in a subsequent step. Alternative conducting materials that can be used to fill the DT and thus form the second electrode of the DT capacitor include, but are not limited to, amorphous silicon, germanium, silicon germanium, a metal (e.g., tungsten, titanium, tantalum, ruthenium, platinum, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), carbon nanotube, conductive carbon, or any suitable combination of these materials and polysilicon.

Figure 3B:
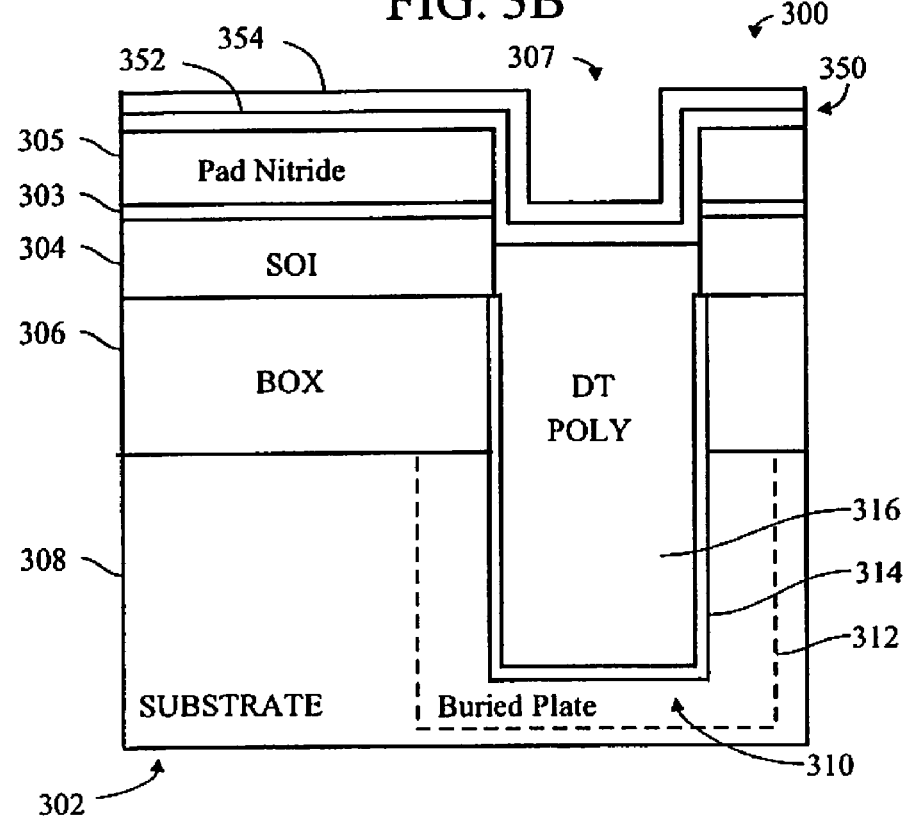

FIG. 3B illustrates a next step in the overall process of forming a DRAM cell with a liner protecting the poly node, according to an exemplary embodiment of the invention. In this step, a "bi-layer" liner 350, comprising oxide and nitride layers is deposited, as follows.

A thin layer of oxide 352 is formed over the surface of the substrate, and extends into the trench 307, covering the top surface of the poly node 316, as well as the exposed sidewall of the opening 307 at the top portion of the trench 31O. The oxide layer 352 may have an exemplary thickness of 1-10 nm.

The thin layer of oxide 352 can be formed by conventional deposition technique such as chemical vapor deposition (CVD), atomic layer deposition (ALD), high temperature oxide deposition (HTO), or low temperature oxide deposition (LTO). Alternatively, this oxide spacer protection layer can be formed by converting a portion of the underlying nitride and silicon into oxide. A portion of the nitride and silicon can be converted to the thin layer oxide by oxidation such as in-situ steam generation (ISSG), radical-based oxidation, wet oxidation, dry oxidation.

Finally, the thin layer of oxide 352 layer can also be formed by first depositing an amorphous or polycrystalline silicon on the nitride layer and then converting the silicon layer into silicon oxide by oxidation.

A thin layer of nitride 354 is deposited over the thin layer of oxide 352, and also extends into the trench 307 and over the top surface of the DT poly 316. The nitride layer 354 may have an exemplary thickness of 5-20 nm.

The thin layer nitride 354 can be deposition by atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ion beam deposition, electron beam deposition, laser assisted deposition, or chemical solution deposition.

The top surface of the nitride liner 354, over the poly node 316, is shown substantially even with (at the same height as) the top surface of the pad oxide 303 over the SOI 304.

Figure 3C:
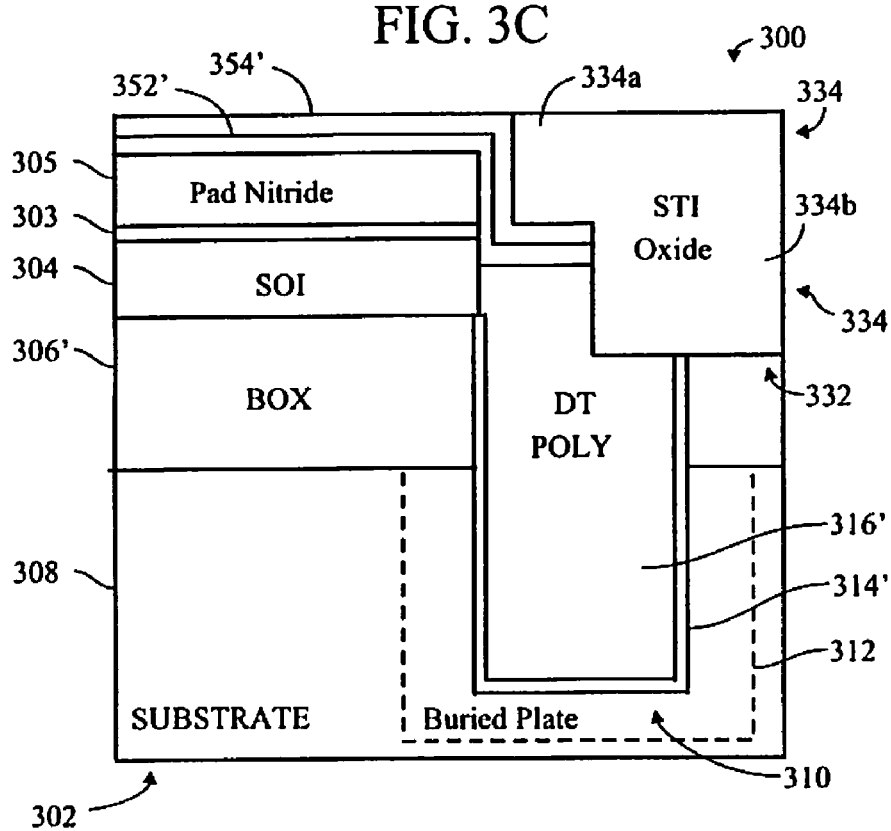

FIG. 3C illustrates a next step in the overall process of forming a DRAM cell with a liner protecting the poly node, according to an exemplary embodiment of the invention. In this step, STI is formed by patterning, etching, oxide deposition and planarization, as follows.

As before, a shallow trench 332 (compare 232) may be formed, for surrounding the access transistor (not shown, compare 220). A mask layer (not shown) such as photoresist with an optional hardmask layer such as oxide or polysilicon would be deposited and patterned on the surface of the nitride 354, leaving openings over an area whereat it is desired to etch the trench 332 for STI, and STI oxide would be deposited in the trench 332.

As before, note that the trench 332 extends over the poly node 316. The trench 332 is less deep (thinner) where it is immediately adjacent the SOI 304 (where the drain (D) of the access transistor will be formed), and may be deeper (thicker) where it is further from the SOI 304.

As before, the STI trench 332 may be filled with an insulating material, such as oxide 334 (compare 234). Because of the thin/thick trench geometry which has been described, the STI oxide 334 will exhibit a thin portion 334a where it is proximal (adjacent to) the drain (D) of the access transistor, and a thicker portion 334b where it is distal from (not immediately adjacent to) the drain (D) of the access transistor Notice that, as a result of STI trench formation (and filling), the poly node poly 316' (prime) has been altered, as well as the insulating layer 314' (prime).

Notice that the oxide layer 352' (prime) and the nitride layer 354' (prime) both have been altered, having been removed over a portion of the poly node 316' where the STI trench 332 is formed, remaining over the portion of the poly node 316' adjacent where the access transistor will be formed (in the SOI 304), and remaining, exposed, over the SOI 304 (and over the pad nitride 305). Some of the oxide 352' and nitride 354' remains over the left hand portion of the poly node 316', which is the portion of the poly node 316' that is adjacent the to-be-formed access transistor.

Notice that the BOX 306' (prime) may have been altered (thinned, on the outer side of the DT poly 316', away from the SOI 304) as a result of STI trench formation.

Figure 3D:
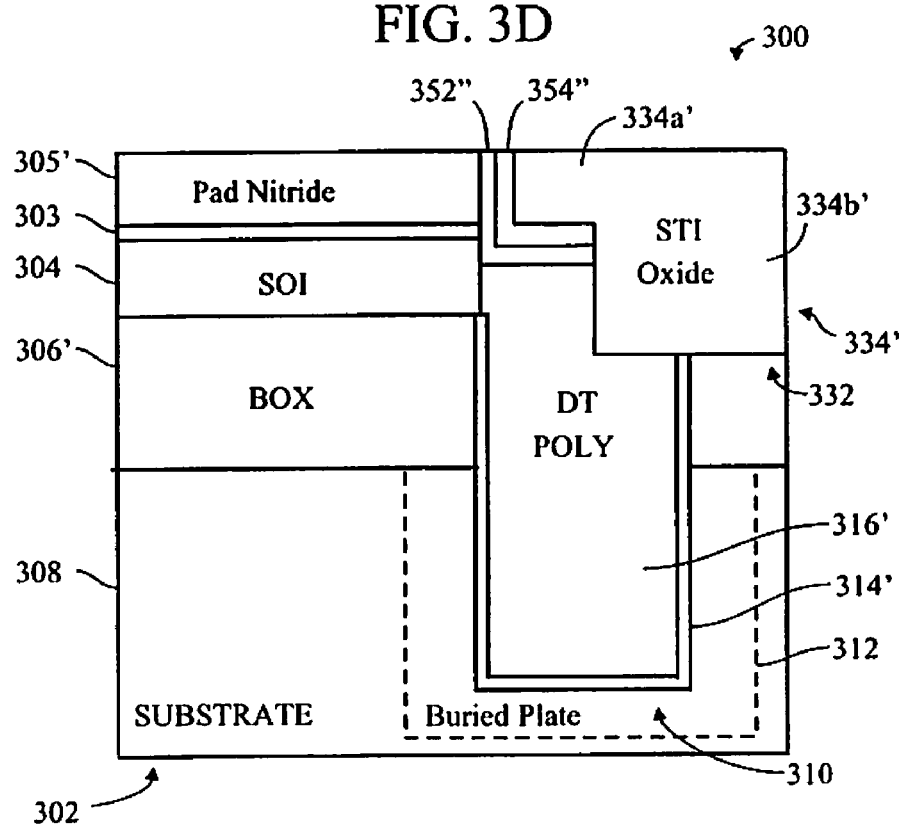

FIG. 3D illustrates a next step in the overall process of forming a DRAM cell with a liner protecting the poly node, according to an exemplary embodiment of the invention. In this step, exposed nitride liner and oxide liner on pad nitride are removed, as follows.

This step may be done without masking, relying on selective etch to remove nitride 354' and oxide 352' which were exposed, over the pad nitride 305. This leaves oxide 352" and nitride 354", as follows.

The oxide 352" is generally L-shaped, having a horizontal portion overlying a top surface of the poly node 316' adjacent the SOI 304, and a vertical portion extending upward from the left-hand side (as viewed) of the horizontal portion.

The nitride 354" is generally L-shaped, having a horizontal portion overlying a top surface of the horizontal portion of the oxide 352", and a vertical portion extending upward from the left-hand side (as viewed) of the horizontal portion.

As a result of the etch, the STI oxide 334' (prime) may be slightly thinned, as well as the thin portion 334a' and thick portion 334b'.

As a result of the etch, the pad nitride 305' (prime) may be slightly thinned.

Figure 3E:
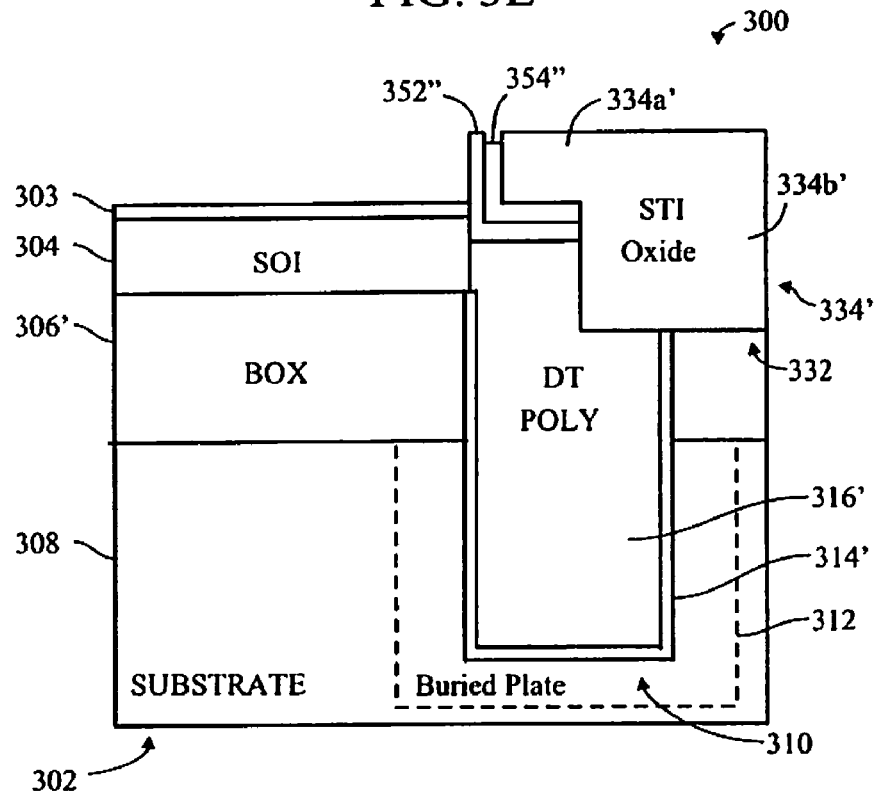

FIG. 3E illustrates a next step in the overall process of forming a DRAM cell with a liner protecting the poly node, according to an exemplary embodiment of the invention. In this step, the pad nitride is stripped, as follows.

The pad nitride 305' is removed by using a suitable etch, for example, a wet etch using a solution containing hot phosphoric or a dry etch such as chemical downstream etch. This etch (pad nitride strip) process is selective to oxide. Therefore, the oxide liner 352" and STI oxide 334' prevent the nitride liner 354" from being undercut. The vertical portion of the nitride liner 352" may be slightly etched, and the STI oxide 334' may be slightly thinned.

Figure 3F:
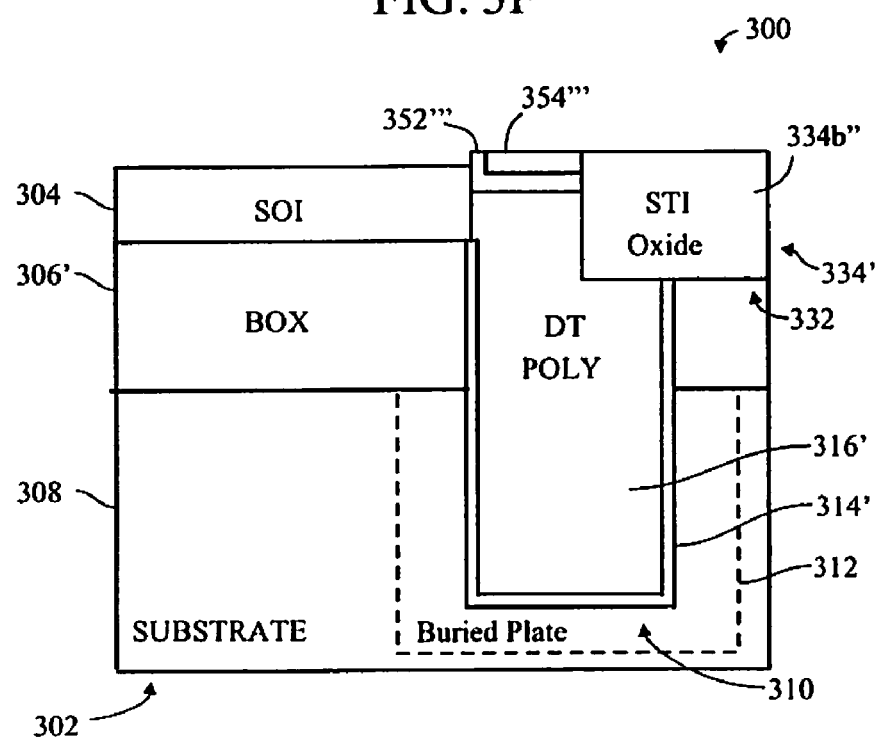

FIG. 3F illustrates a next step in the overall process of forming a DRAM cell with a liner protecting the poly node, according to an exemplary embodiment of the invention. In this step, an oxide etch is performed to strip the remaining pad oxide and exposed portion of the oxide liner. The STI (also oxide) will also be partially stripped, particularly the portion of the STI which was over the nitride liner, as follows.

The pad oxide 303 is completely removed and the vertical portion of the oxide liner 352''' (triple prime) has been substantially removed, leaving behind the horizontal portion.

The thin portion 334a' of the STI 334' has also been removed, leaving behind the thicker portion 334b' of the STI 334'.

The vertical portion of the nitride liner 354''' (triple prime) has been removed, leaving behind the horizontal portion.

A wet etch with an etchant containing hydrofluoric acid, or alternatively, chemical oxide etch (COR), can be used for oxide etch, can be used to etch oxide in the above processes.

A wet etch with an etchant containing hot phosphoric acid, or alternatively, a dry etch such as chemical downstream etch, can be used to etch nitride in the above processes.

Alternatively, a wet etch with an etchant containing hydrofluoric/ethylene glycol (HF/EG) can be used to simultaneously etch oxide and nitride in the above processes.

Figure 3G:
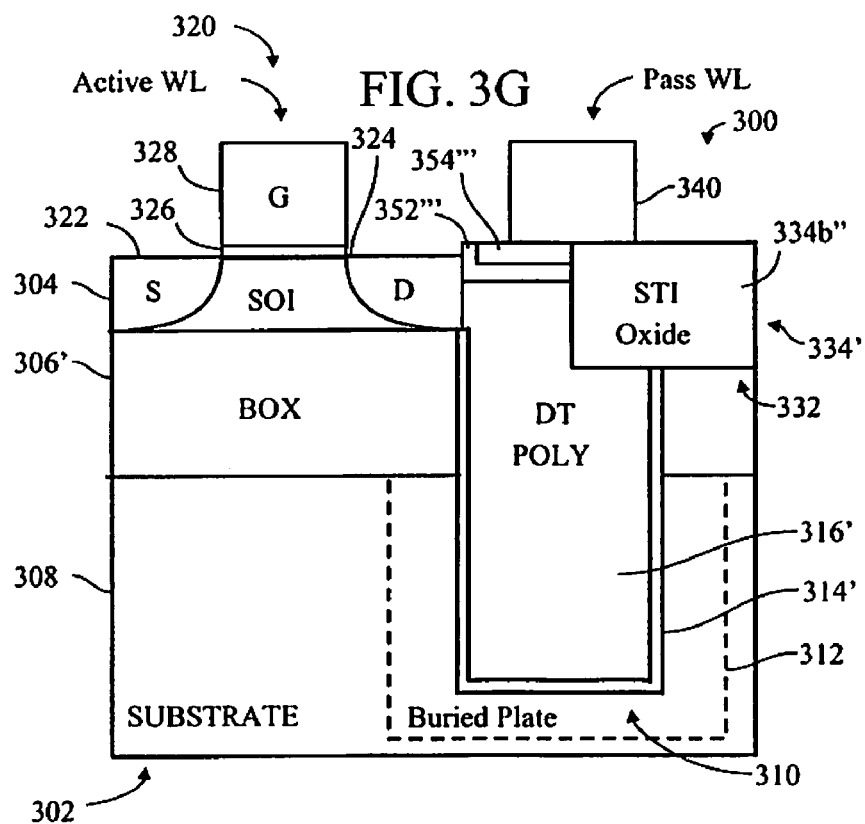

FIG. 3G illustrates a next step in the overall process of forming a DRAM cell with a liner protecting the poly node, according to an exemplary embodiment of the invention. In this step, transistors are formed, as follows.

An access transistor (FET) 320 (compare 220) is shown, comprising a source (S) diffusion 322 (compare 222), a drain diffusion (D) 324 (compare 224), gate oxide 326 (compare 226) and a gate (G) 328 (compare 228). The gate (G) 328 may be formed by an "Active" wordline (WL).

A "Pass WL" 340 (compare 240) is shown, passing over the STI 334', above the poly node 316', and may serve as the gates of other access transistors connected to the "Pass" wordline. The Pass WL 340 may thus also be referred to as a "pass gate".

The nitride liner 354''' and oxide liner 352''' provide isolation between the pass gate 340 and the poly node 316'.

Another Embodiment

Generally, in this embodiment, the process is the same as the previously-described embodiment, up to the pad nitride strip (FIGS. 3A-3E), after which some STI remains atop the nitride/oxide liners. (Compare FIG. 3F where the portion of the STI which was over the nitride liner was stripped.)

The steps described with respect to FIGS. 3A-3E are performed, as described hereinabove, which generally comprise:
(FIG. 3A) form trench capacitor on SOI substrate by conventional process
(FIG. 3B) deposit oxide and nitride liners
(FIG. 3C) form STI by patterning, etching, oxide deposition and planarization
(FIG. 3D) remove exposed nitride liner and oxide liner on pad nitride
(FIG. 3E) strip pad nitride FIG. 4A (compare FIG. 3E) illustrates a first step in an overall process of forming a DRAM cell with a liner protecting the poly node, according to this alternate embodiment of the invention.

FIG. 4A is substantially identical to FIG. 3E, and illustrates a stage in the process where the DRAM cell 400 (compare 300) comprises: an SOI substrate 302 (compare 302) comprises a SOI layer 404 (compare 304) over BOX 406 (compare 306) over a silicon substrate 408 (compare 308), and a pad oxide 403 (compare 303) layer over the SOI 404 (the pad nitride layer (305) is not shown, as it would already have been removed); a cell capacitor comprising a trench 410 (compare 310), a buried plate 412 (compare 312), an insulator 414 (compare 314), and a poly node 416 (compare 316) in contact with the SOI 404; an STI trench 432 (compare 332) filled with STI oxide 434' (compare 334') having a thin portion 434a' (compare 334a') adjacent to the SOI 404 and a thick portion 434b' (compare 334b') distant from the SOI 404; an oxide layer 452 (compare 352) disposed over the poly node 416, covering at least a portion of the poly node 416 adjacent the SOI 404; and a nitride layer 454 (compare 354) disposed over the oxide layer 452.

FIG. 4B (compare FIG. 3F) illustrates a next step in the overall process of forming a DRAM cell with a liner protecting the poly node, according to this alternate embodiment of the invention. In this step, an oxide etch is performed to strip the remaining pad oxide and exposed portion of the oxide liner, as follows.

The pad oxide 403 is completely removed.

The vertical portion of the oxide liner 452' (prime) has been substantially removed, leaving behind the horizontal portion.

The vertical portion of the nitride liner 454' (prime) has been removed, leaving behind the horizontal portion.

Whereas, in the previous embodiment, the thin portion 334' of the STI 334' was removed (completely), in this embodiment a remaining, thinned portion 434a" (double prime) of the STI 434' is left remaining (extends) over the nitride liner 454'. The overall STI 434" (double prime) has been altered, as well as the thick portion 434b" (double prime).

The remaining STI oxide 434a" depends on pad nitride thickness after STI oxide CMP and the amount of oxide etched in the subsequent processes, both of which may have a large variation from wafer-to-wafer and from region-to-region within the same wafer.

FIG. 4C (compare FIG. 3G) illustrates a next step in the overall process of forming a DRAM cell with a liner protecting the poly node, according to this alternate embodiment of the invention. In this step, transistors are formed, as follows.

An access transistor (FET) 420 (compare 320) is shown, comprising a source (S) diffusion 422 (compare 322), a drain diffusion (D) 424 (compare 324), gate oxide 426 (compare 326) and a gate (G) 428 (compare 328). The gate (G) 428 may be formed by an "Active" wordline (WL).

A "Pass WL" 440 (compare 340) is shown, passing over the STI 434", above the poly node 416, and may serve as the gates of other access transistors connected to the "Pass" wordline. The Pass WL 440 may thus also be referred to as a "pass gate".

The remaining thin portion 434a" of the STI 434", the nitride liner 454" and the oxide liner 452" provide isolation between the pass gate 440 and the poly node 416.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A memory cell comprising an access transistor and a capacitor, the capacitor comprising an electrode disposed within a deep trench, comprising:
   STI oxide disposed atop and in contact with a portion of a top surface of the electrode; and
   a liner disposed atop and in contact with a remaining portion of the top surface of the electrode; and
   a wordline disposed above the electrode and isolated from the electrode by both the STI oxide and the liner which are in direct contact with the electrode and the wordline.

2. The memory cell of claim 1, wherein:
   the liner comprises a layer of oxide.

3. The memory cell of claim 1, wherein:
   the liner comprises a layer of nitride.

4. The memory cell of claim 1, wherein:
   the liner comprises a layer of nitride over a layer of oxide.

5. The memory cell of claim 1, wherein:
   a portion of the STI oxide extends over the liner.

6. The memory cell of claim 1, wherein:
   the electrode is recessed within the deep trench.

7. A memory array comprising:
   at least two wordlines, one of which is an active wordline, another of which is a pass wordline;
   a memory cell comprising an access transistor and a capacitor, the capacitor comprising an electrode disposed within a deep trench;
   STI oxide disposed atop and in contact with a portion of a top surface of the electrode;
   a liner disposed atop and in contact with a remaining portion of the top surface of the electrode; and
   wherein the pass wordline is disposed above the electrode and isolated from the electrode by both the STI oxide and the liner which are in direct contact with the electrode and the wordline.

8. The memory array of claim 7, wherein:
   the pass wordline is isolated from the electrode by the STI oxide.

9. The memory array of claim 7, wherein:
   the liner comprises a layer of oxide.

10. The memory array of claim 7, wherein:
    the liner comprises a layer of nitride.

11. The memory array of claim 7, wherein:
    the liner comprises a layer of nitride over a layer of oxide.

12. The memory array of claim 7, wherein:
    a portion of the STI oxide extends over the liner.

13. The memory array of claim 7, wherein:
    the electrode is recessed within the deep trench.

14. A method of providing isolation for a pass wordline passing over a trench capacitor of a memory cell associated with an active wordline, the capacitor comprising an electrode disposed within a deep trench, the method comprising:
    disposing STI oxide atop and in contact with a portion of the electrode; and
    disposing a liner atop and in contact with a remaining portion of the electrode;
    disposing the pass wordline above and not aligned with the deep trench, the pass wordline further being disposed above the electrode and isolated therefrom by both the STI oxide and the liner which are both in direct contact with the electrode and the wordline.

15. The method of claim 14, wherein:
    the liner comprises a layer of oxide.

16. The method of claim 14, wherein:
    the liner comprises a layer of nitride.

17. The method of claim 14, wherein:
    the liner comprises a layer of nitride over a layer of oxide.

18. The method of claim 14, wherein:
    a portion of the STI oxide extends over the liner.

19. The method of claim 14, wherein:
    the electrode is recessed within the deep trench.

20. The method of claim 14, wherein:
    the electrode comprises polysilicon.

* * * * *